(12) United States Patent
Wessling

(10) Patent No.: US 7,547,479 B2
(45) Date of Patent: Jun. 16, 2009

(54) TIN-COATED PRINTED CIRCUIT BOARDS WITH LOW TENDENCY TO WHISKER FORMATION

(75) Inventor: Bernhard Wessling, Bargteheide (DE)

(73) Assignee: Ormecon GmbH, Ammersbek (DE)

( * ) Notice: Subject to any disclaimer, the term of this patent is extended or adjusted under 35 U.S.C. 154(b) by 63 days.

(21) Appl. No.: 11/165,410

(22) Filed: Jun. 23, 2005

(65) Prior Publication Data

US 2006/0035105 A1    Feb. 16, 2006

(30) Foreign Application Priority Data

Jun. 25, 2004 (DE) .................. 10 2004 030 930

(51) Int. Cl.
    *B32B 15/00* (2006.01)
(52) U.S. Cl. .................. 428/646; 428/618; 428/668; 428/689
(58) Field of Classification Search .................. 428/209
    See application file for complete search history.

(56) References Cited

U.S. PATENT DOCUMENTS

| | | | |
|---|---|---|---|
| 4,657,632 A | | 4/1987 | Holtzman et al. |
| 5,192,835 A | * | 3/1993 | Bull et al. .................. 174/260 |
| 5,532,025 A | | 7/1996 | Kinlen |
| 5,645,890 A | | 7/1997 | MacDiarmid |
| 5,720,903 A | * | 2/1998 | Wessling et al. ............. 252/500 |
| 5,846,606 A | * | 12/1998 | Wessling .................. 427/340 |
| 5,922,466 A | | 7/1999 | Angelopoulos |
| 6,015,482 A | | 1/2000 | Stern et al. |
| 6,015,613 A | | 1/2000 | Kinlen et al. |
| 6,123,995 A | | 9/2000 | Sonnenberg et al. |
| 6,194,087 B1 | * | 2/2001 | Huhn et al. .................. 428/646 |
| 6,361,823 B1 | | 3/2002 | Bokisa |
| 6,592,020 B1 | * | 7/2003 | Currie et al. ................. 228/224 |
| 6,773,568 B2 | | 8/2004 | Egli et al. |
| 6,784,530 B2 | * | 8/2004 | Sugaya et al. ............... 257/686 |
| 6,962,642 B2 | | 11/2005 | Knadle |
| 7,018,866 B2 | * | 3/2006 | Sugaya et al. ............... 438/108 |
| 7,087,441 B2 | * | 8/2006 | Konrad et al. .................. 438/14 |
| 7,105,221 B2 | | 9/2006 | Akamatsu et al. |
| 2002/0187364 A1 | | 12/2002 | Heber |
| 2003/0075270 A1 | | 4/2003 | Landi et al. |
| 2004/0086697 A1 | | 5/2004 | Egli et al. |

FOREIGN PATENT DOCUMENTS

| | | |
|---|---|---|
| CA | 2000431 | 1/2000 |
| DE | 43 33 127 A1 | 9/1993 |
| DE | 42 38 765 | 5/1994 |
| DE | 195 25 708 C1 | 1/1997 |
| DE | 102 34 363 A1 | 2/2004 |
| EP | 0 407 492 B1 | 7/1997 |
| EP | 0 807 190 B1 | 10/1997 |
| EP | 0 656 958 B1 | 4/1999 |
| EP | 0 700 573 B1 | 2/2002 |
| EP | 1 477 587 | 11/2004 |
| GB | 2 126 250 | 3/1984 |
| JP | 2002-289653 | * 10/2002 |
| JP | 2003 129 278 | 5/2003 |
| JP | 2003 332 391 | 11/2003 |
| WO | WO 94/27297 | 11/1994 |
| WO | WO 95/00678 | 1/1995 |
| WO | WO 95/09255 | 4/1995 |
| WO | WO 97/20084 | 6/1997 |
| WO | WO 99/05687 | 2/1999 |
| WO | WO 2004/016698 | 2/2004 |

OTHER PUBLICATIONS

Wessling et al. (2000) Eur. Phys. J. E 2:207-210.
Ormecon CSN process, Ormecon GmbH, Ammersbek.
Ormecon CSN FF process, Ormecon GmbH, Ammersbek.
Brusic et al. (1997) J. Electrochem. Soc. 144(2);436-442.
Parquet and Boggs (1995) Electronic Packaging & Productions 9(Aug.):38-42.
Posdorfer and Wessling (2000) Ormecon GmbH, Ammersbek "Oxidation of copper in the presence of Organic metal polyaniline".

* cited by examiner

*Primary Examiner*—Cathy Lam
(74) *Attorney, Agent, or Firm*—Swanson & Bratschun, L.L.C.

(57) ABSTRACT

A coated article, which contains (i) at least one electrically non-conductive base layer, (ii) at least one layer of copper and/or a copper alloy, and (iii) a tin-containing layer, wherein the layer (ii) is positioned between the layer (i) and the layer (iii). The article is characterized in that the tin-containing layer (iii) contains at least one other metal.

19 Claims, 6 Drawing Sheets

16

TIN-COATED PRINTED CIRCUIT BOARDS WITH LOW TENDENCY TO WHISKER FORMATION

RELATED APPLICATION DATA

This application claims benefit of commonly assigned and copending German Patent Application Serial Number 10 2004 030 930.2, filed Jun. 25, 2004, entitled TIN-COATED PRINTED CIRCUIT BOARDS WITH LOW TENDENCY TO WHISKER FORMATION, which application is incorporated herein in its entirety by reference.

TECHNICAL FIELD

The invention concerns coated articles which contain a layer of copper or a copper alloy and a tin-containing layer, wherein the tin-containing layer contains tin and at least one other metal. The articles are particularly suitable as printed circuit boards or for the production of printed circuit boards.

BACKGROUND ART

In general, before their assembly, directly after the production of the conductor track structures, printed circuit boards are provided with a protective layer on the exposed copper surfaces and in the copper-plated drill holes, whose purpose is to guarantee that all soldering points that are to be formed during assembly satisfy all requirements both electrically and mechanically. The protective layers thus serve to safeguard the solderability and are often described as "final solderable surfaces".

Solderable surfaces are currently normally produced in the industry from liquid solder (tin-lead or silver-tin solders, so-called "hot air tinning") or chemically deposited nickel-gold, silver, palladium or tin layers. Such metallic finishes are designed for a storage time of up to one year, while purely organic finishes (so-called "OSP"), which are obtained by the treatment of the printed circuit board surface with complexing agents for copper, cannot usually be stored for longer than 3 to 6 months, if the solderability is to be maintained. As complexing agents, for example imidazoles, benzimidazoles, benzotriazoles, thiourea and imidazole-2-thione are used.

Metallic coatings are in general very suitable for printed circuit boards, however they also display a number of disadvantages. Coatings with gold are expensive not only on account of the high gold price, but in addition require special processes for the application of the gold layer. For example, gold cannot be applied chemically in so-called horizontal plants but only in vertical plants, which additionally results in high process costs.

The application of silver is poorly reproducible, and the necessary plants are difficult to adjust.

In recent years, therefore, there has been increasing interest in chemical tinning, not least because of enormous improvements in properties which it was possible to achieve on the basis of tin deposition with the aid of the organic metal polyaniline ("ORMECON CSN process" of Ormecon GmbH, Ammersbek), but also through intensified endeavours by the firm Atotech ("Stannatech" process). Tin surfaces are considerably more economical than for example coating with Ni/Au.

From EP 0 807 190 B1, a process for the production of metallized materials is known, wherein the material to be metallized is first coated with an intrinsically conductive polymer, the intrinsically conductive polymer is then activated by reduction and finally the metal is applied in a non-electrochemical manner, in that the coated material is brought into contact with a solution of ions of the metal. The process is particularly suitable for the deposition of tin onto copper but also for the metallization of plastic surfaces.

A disadvantage of tin surfaces can be seen in the fact that these more or less strongly tend to form, in the course of the storage time, so-called "whiskers", i.e. needle-shaped tin crystals, which can reach several micrometres in length and which can severely impair the function of a printed circuit board. Such incidents some years ago finally resulted in tin surfaces only finding reluctant acceptance for certain applications such as flexible printed circuit boards, "tape automated bonding" (TAB) processes and "dupon film" (COF) processes, and in certain regions, such as Japan.

It has not so far been possible completely to elucidate the cause of the whisker formation, however the general view is that mechanical stresses which are transmitted through the printed circuit board into the copper and tin layer, or arise in the tin-coated Cu layer, cause the needle formation in the course of a tension-induced crystallization.

After a storage time of 7 weeks at room temperature, conventional tin surfaces display whiskers with a length of 30 μm to more than 100 μm. The whisker formation can be detected particularly well microscopically in drill holes with a diameter of 0.6 to 1.2 mm diameter. Whiskers also arise at other points, but their assessment with the microscope is easier in drill holes. After 7 weeks, tin surfaces created by the ORMECON CSN process display whiskers about 10 to 20 μm in size.

U.S. Pat. No. 6,361,823 discloses a process with which whisker formation is allegedly completely prevented. In this process, printed circuit boards are first provided with a layer of essentially pure tin, onto which an alloy layer of at least two metals is applied. The preferred alloying metals are tin and silver. Practical tests have however shown that whisker formation could admittedly be reduced, but not reproducibly and not to the desired extent.

The firm Unicron GmbH, Kirchheimbolanden, developed and for a time marketed a process wherein first a silver layer is deposited onto the exposed copper surfaces, then the tin layer is deposited by the UNICRON process (G 2). However this process brought hardly any improvement, on the one hand since with too little silver deposition no effect whatever could be achieved, and on the other hand with too great a silver layer thickness (beyond as little as ca. 40 nm layer thickness), tin was no longer deposited. Ultimately, the desired result could not be achieved with this process.

Thus, as before, there was still a need for the provision of protective coatings for printed circuit boards, which display no tendency or only a slight tendency to whisker formation.

SUMMARY OF THE INVENTION

This object is achieved through coated articles which contain
(i) at least one electrically non-conductive base layer,
(ii) at least one layer of copper and/or a copper alloy, and
(iii) a tin-containing layer.

The layer (ii) is positioned between the layer (i) and the layer (iii). The articles are characterized in that the tin-containing layer (iii) contains at least one other metal.

DETAILED DESCRIPTION OF THE PREFERRED EMBODIMENT

Figure 1:
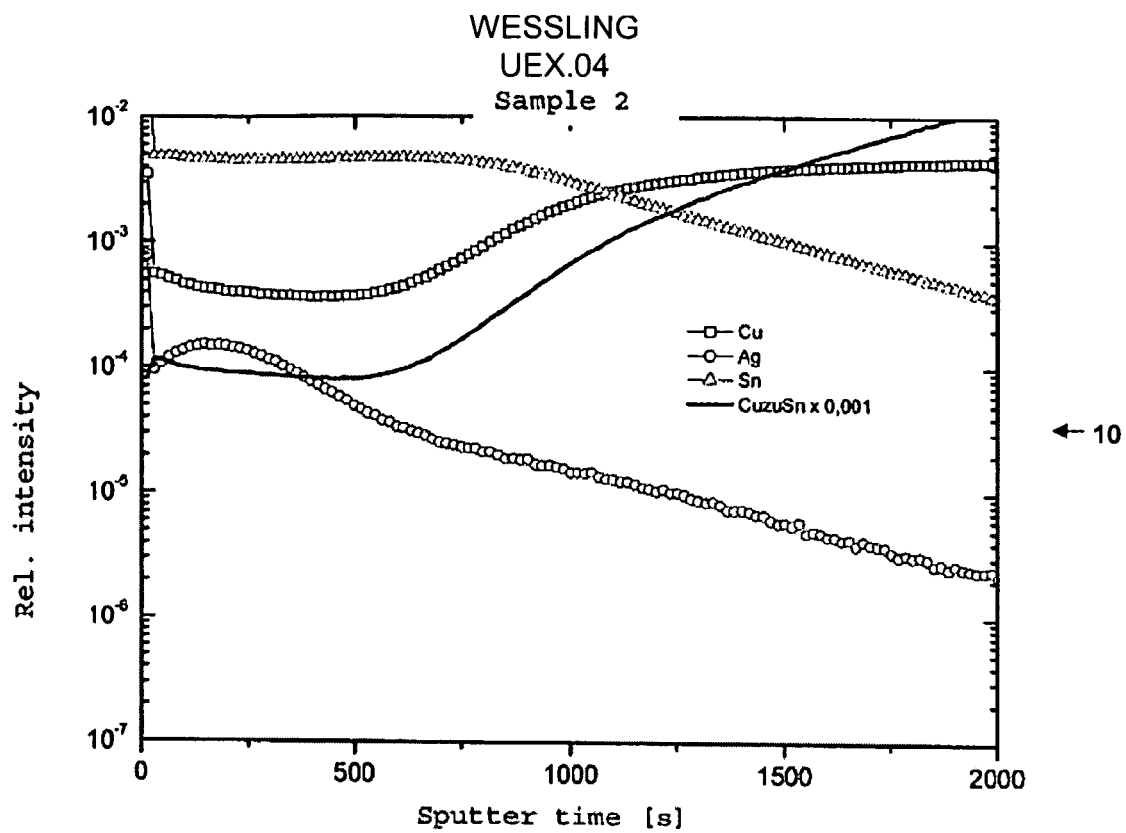
FIG. 1 shows a secondary ion mass spectrum of the layer (iii) of a printed circuit board according to the invention.

It has surprisingly been found that the whisker formation can be effectively suppressed if tin-containing layers which contain at least one other metallic element are used for the coating of printed circuit boards.

Suitable as other metals are those metals which are soluble in copper and/or tin or can form alloys with copper and/or tin. Preferably the layer (iii) contains at least one other metal which is selected from Mg, Ca, Zr, Mn, Ni, Pd, Pt, Cu, Ag, Au, Zn, Ga, In, Ge, Sb, and Bi. A preferred group of metals is Ca, Zr, Mn, Ni, Pd, Pt, Ag, Au, Ga, In, Ge, Sb, and Bi. Particularly preferred as other metals are silver, platinum, gold, nickel, bismuth, copper and combinations of two or more of these metals.

The layer (iii) can contain an alloy of tin and the other metal or metals. According to an alternative version, the layer (iii) contains a finely divided or multiphase mixture of tin and the other metal or metals. In the latter case, the metal particles or the metal phases preferably have a size of 1 to 500 nm.

When the term "alloy" is used below, this is understood to mean both alloys in the narrower sense (i.e. mixtures of metals at the atomic level) and also finely divided or multiphase mixtures. Finely divided mixtures are dispersions of one or several metals in finely divided form in a matrix of another metal.

The layer (iii) can additionally contain one or several organically based additives, preferably an additive which contains at least one of the elements carbon, sulphur and/or nitrogen.

Particularly suitable as organic additives are complexing agents and/or electrically conductive polymers.

Complexing agents which are capable of complex formation with copper are preferable, in particular thiourea, imidazoles, benzimidazoles, benzotriazoles, urea, citric acid, imidazole-2-thione and mixtures thereof.

The layer (iii) can also contain at least one electrically conductive polymer, which is preferably used in the form of an organic metal. Combinations of different substances from this substance class can be used. In the context of this invention, if not otherwise stated, polymers are understood to mean organic polymers.

Electrically conductive polymers or conductive polymers, which are also described as "intrinsically conductive polymers", are understood to mean substances which are built up of small molecule compounds (monomers), are at least oligomeric by polymerization, and thus contain at least 3 monomer units which are linked by chemical bonding, display a conjugated π-electron system in the neutral (non-conductive) state and can be converted by oxidation, reduction or protonation (which is often described as "doping") into an ionic form which is conductive. The conductivity is at least $10^{-7}$ S/cm and is normally less than $10^5$ S/cm.

As doping agents, for example iodine, peroxides, Lewis and protic acids are used in the case of doping by oxidation, or for example sodium, potassium, calcium in the case of doping by reduction.

Conductive polymers can be chemically exceptionally diverse in composition. As monomers, for example acetylene, benzene, naphthalene, pyrrole, aniline, thiophene, phenylene sulphide, perinaphthalene and others, and derivatives thereof, such as sulphoaniline, ethylenedioxythiophene, thienothiophene and others, and alkyl or alkoxy derivatives thereof or derivatives with other side-groups, such as sulphonate, phenyl and other side-groups, have proved useful. Combinations of the aforesaid monomers can also be used as monomers. For this, for example aniline and phenylene sulphide are linked, and these A-B dimers then used as monomers. Depending on the objective, for example pyrrole, thiophene or alkylthiophenes, ethylenedioxythiophene, thienothiophene, aniline, phenylene sulphide and others can be bound together into A-B structures and these then converted into oligomers or polymers.

Most conductive polymers display a more or less strong rise in conductivity with increasing temperature, which identifies them as non-metallic conductors. Other conductive polymers display a metallic behaviour at least in a temperature range close to room temperature in that their conductivity decreases with increasing temperature. A further method of recognising metallic behaviour consists in the plotting of the so-called "reduced activation energy" of the conductivity against the temperature at low temperatures (down to near 0 K). Conductors with a metallic contribution to the conductivity display a positive gradient of the curve at low temperature. Such substances are described as "organic metals".

Organic metals are known per se. According to Weßling et al., Eur. Phys. J. E 2, 2000, 207-210, the transition from the state of a nonmetallic to an at least partially metallic conductor can be effected by a single-step frictional or dispersion procedure after completion of the synthesis of the intrinsically conductive polymer, the process technology basis whereof is described in EP 0 700 573 A. In this way, through the dispersion procedure the conductivity is also increased, without the chemical composition of the conductive polymer used being significantly altered.

Preferred intrinsically conductive polymers are those mentioned above. In particular, the following can be mentioned as examples: polyaniline (PAni), polythiophene (PTh), poly(3,4-ethylenedioxy-thiophenes) (PEDT), polydiacetylene, polyacetylene (PAc), poly-pyrrole (PPy), polyisothianaphthene (PITN), polyheteroarylene-vinylene (PArV), wherein the heteroarylene group can for example be thiophene, furan or pyrrole, poly-p-phenylene (PpP), polyphenylene sulphide (PPS), polyperinaphthalene (PPN), poly-phthalocyanine (PPc) inter alia, and derivatives thereof (which are for example formed with monomers substituted with side-chains or -groups), copolymers thereof and physical mixtures thereof. Particularly preferred are polyaniline (PAni), polythiophene (PTh), polypyrrole (PPy), and derivatives thereof and mixtures thereof. Most preferred is polyaniline.

Mixtures of complexing agents and electrically conductive polymers are also suitable.

The layer (iii) preferably contains:

| | |
|---|---|
| 20 to 99.5 wt. % | tin, |
| 0.01 to 80 wt. % | other metal, |
| 0 to 80 wt. % | complexing agent and |
| 0 to 80 wt. % | electrically conductive polymer, | each based on the total mass of the layer (iii).

The organic additive(s) are preferably used in a quantity of 1 ppb to 5 wt. % based on the total mass of the layer (iii).

As base layer (i), all materials used in printed circuit board technology are suitable, in particular epoxides and epoxide composites, Teflon, cyanate esters, ceramics, cellulose and cellulose composites, such as for example cardboard, materials based on these substances and flexible base layers, for example based on polyimide. The base layer preferably has a layer thickness of 0.1 to 3 mm.

The copper layer or copper alloy layer (ii) preferably has a thickness of 5 to 210 μm, in particular 15 to 35 μm.

The layer (iii) preferably has a layer thickness of 50 nm to 4 μm, particularly preferably 100 nm to 3.5 μm, quite particularly preferably 200 nm to 3 μm and in particular 200 nm to 2 μm.

The other metal or metals are preferably not homogeneously distributed in the layer (iii), i.e. the concentration of the other metal varies over the thickness of the layer (iii).

Down to the depth at which the tin concentration in the layer (iii) is more than 50 mol. %, the other metal or metals are preferably present in a concentration of more than 100 ppm and less than 50 mol. %. Particularly preferred are layers (iii), wherein the tin concentration in the outer 300 nm to 3 μm of the layer (iii) is more than 50 mol. %.

The concentration of the other metal or metals is preferably graded as follows. In the outer 0.5 to 5% of the layer, the concentration of the other metal or metals is lower than in the next 2 to 10% of the layer, and is higher there than in the 5 to 95% of the layer lying thereunder. The percentage values given are based on the layer thickness.

The articles according to the invention are particularly suitable for the production of printed circuit boards, and the articles are preferably printed circuit boards which are also described as boards. These are thin plates used for the assembly of electrical components, which can have holes. The holes serve for example for the connection of the upper and underside of the plates, for the supply of solder or for accommodating the leads of components for further soldering.

For the production of the coated articles according to the invention and in particular of printed circuit boards
(1) a layer of copper or a copper-containing alloy is applied onto the surface of a base layer,
(2) the layer produced in step (1) is structured, and
(3) a tin-containing layer is then applied onto the structured copper or copper alloy layer.

According to a preferred version of the process, the copper or copper alloy layer (ii) is degreased and cleaned following step (1). For this the articles are preferably treated with normal commercial acidic or basic cleaners. Cleaners based on sulphuric acid and citric acid, such as for example the cleaner ACL 7001 from Ormecon GmbH, are preferred. The articles are preferably left in the cleaning bath for about 2 minutes at 45° C. and then washed with water.

In addition, it is preferable to pretreat the copper or copper alloy layer (ii) oxidatively following step (1) or after the cleaning, for example by etching the surface with $H_2O_2$ or inorganic peroxides. Suitable etching solutions are commercially available, for example the hydrogen peroxide-containing solution Etch 7000 from Ormecon GmbH. The articles are preferably left in the etching solution for about 2 minutes at 30° C.

The layer produced in step (1) is preferably structured by lithographic or etching processes, whereby the land pattern is created. The steps (1) and (2) can nowadays also be replaced by the direct application of a structured Cu conductor track or similar processes.

Following step (2), drill holes ("holes") are if necessary created, which are then copper-plated.

The implementation of the individual steps of the above process is known per se to the skilled person.

In step (3) the tin-containing layer is preferably applied onto the layer formed in step (2) by depositing tin and the other metal chemically by complex formation and redox processes from a bath which contains tin ions and ions of the other metal or metals.

Particularly preferred is a process wherein the tin and the other metal or metals are deposited chemically by complex formation and redox processes from two or more different baths which contain tin ions and/or ions of the other metal onto the layer formed in step (2). This process variant makes it possible to use separate baths for the individual metals and optional additives. In this way, the deposition rate of the individual metals and additives can be deliberately controlled, so that their concentration in the layer (iii) can be adjusted reproducibly and with relatively little control expenditure.

Surprisingly, it has been found that layer (iii) can be created in a simple manner by first depositing a layer of the other metal and optinally one or several organic additives onto the layer formed in step (2), and then depositing a tin layer onto the layer of the other metal and the optional organic additive or additives.

Preferably as other metal a metal from the group Mg, Ca, Zr, Mn, Ni, Pd, Pt, Cu, Ag, Au, Zn, Ga, In, Ge, Sb, and Bi is first deposited, it being particularly preferred to effect this in the presence of the aforesaid organic additives. As other metals, silver, platinum, gold, nickel, bismuth and copper are preferred and silver is quite particularly preferred. After this, a tin layer is applied with a conventional tin bath, wherein the tin bath also can contain one or several organic additives. Preferably the other metal or metals are deposited together with a conductive polymer and the tin together with a copper complexing agent.

The layer of the other metal and the optional organic additive or additives is preferably deposited in a thickness of 3 to 100 nm, preferably 10 to 40 nm and quite particularly preferably 10 to 20 nm.

For example in a preferred version the copper surface is first degreased and oxidatively etched, and then treated with a bath which contains Ag cations in dissolved form and polyaniline in colloidally dispersed form; the silver and organic component containing layer is deposited in a thickness of 3 to 100 nm. After this, tin is deposited from an acidic bath containing tin(II) cations and thiourea or another complexing agent.

The tin is deposited in a quantity such that the desired layer thickness is attained, preferably in a layer thickness of 100 nm to 3 μm.

The other metal or metals and the optional organic additive or additives are preferably deposited from one or several aqueous baths which contain ions of the metal or metals in question each in a concentration of 0.003 to 1 wt. % and optionally one or several organic additives each in a concentration of 0.001 to 25 wt.-%. When the bath contains a copper complexing agent as organic additive, this is preferably used in a concentration of 0.1 to 5 wt. %. Electrically conductive polymers are preferably used in a bath concentration of 0.001 to 0.1 wt. %. As copper complexing additives, thiourea, imidazoles, benzimidazoles, benzotriazoles or related compounds such as imidazole-thiones and mixtures thereof are preferably used.

Surprisingly, the process according to the invention does not lead to the formation of a dense layer of the other metal or metals on the surface of the article. Instead, an open pore, porous surface is obtained, which can also be described as membrane-like, sponge-like or foam-like. Studies have shown that apparently for example a compact Ag layer is the reason why the tin is only further deposited very slowly or not at all, while for example an open pore Ag layer does not prevent the subsequent formation of the tin layer.

In contrast to conventional processes, the subsequent deposition of the tin does not give a pure tin layer which forms intermetallic Sn—Cu phases at the interface to the copper layer, but rather it has surprisingly been found that the process according to the invention leads to the formation of a tin alloy which just under the outer surface displays a relatively high concentration of the other metal or metals. Also surprising is the fact that the concentration of the other metal or metals at the copper surface, i.e. where the other metal or metals were originally deposited, is lower than in the sublayer of the layer (iii) lying above this and not higher, as might naturally have been assumed. The other metal or metals are detectable down into the regions of low tin content, and the concentration of the other metal or metals preferably changes by only one power of ten from the outer surface, where the maximum concentration is present just under the surface, although for example the organic additive-containing silver layer is applied as the first onto the copper, into the first copper-rich layers.

According to a particularly preferred version, the layer (iii) contains as other metals silver and copper, and both the silver and also the copper are to be found in considerable quantities at the outer surface of the layer (iii).

It was also observed that the process according to the invention leads to the formation of intermetallic Sn—Cu phases at the interface to copper, which are wider and the phase boundaries less sharp than the Sn—Cu phases formed in conventional processes.

Surprisingly, therefore, the process according to the invention, for example with the use of silver, does not give the defined layer structure to be expected, of the form Sn layer/Ag layer/Cu layer, in some cases with formation of intermetallic phases, but rather a tin layer which displays a relatively high concentration of Ag at the surface, which unexpectedly is found to be higher than in lower layers. The layer (iii) also displays a relatively high Cu concentration in the outer sublayer, and a relatively high Cu concentration in the inner copper-rich layers.

A surprise which is at least as radical consists in the fact that the tin-containing layers (iii) produced according to the invention tend to whisker formation to a considerably lesser extent than known layers. Furthermore, the layers retain their solderability over long time periods. The layer (iii) contains only a few and preferably no whiskers with a length of more than 10 μm and particularly preferably is still free from whiskers (determined by optical microscopic examination) even after storage for 14 weeks at room temperature. There is at present no explanation for the result. It is presumed that the structure of the layer (iii) described above damps the transmission of the stresses which lead to the whisker formation.

Embodiments

Example 1

Production of Coated Printed Circuit Boards

Epoxy resin composite printed circuit boards were cleaned and degreased using a normal commercial cleaner based on sulphuric acid and citric acid (ACL 7001, Ormecon GmbH) in a cleaning bath for 2 minutes at 45° C. The printed circuit boards used had a test design which has been agreed with test institutes and printed circuit board manufacturers and is modelled on real printed circuit board structures. These boards enable the solderability to be measured and assessed. Next, the printed circuit boards were rinsed with tap-water at room temperature and then treated with an $H_2O_2$-containing etching solution (Etch 7000, Ormecon GmbH) for 2 minutes at 30° C. After etching, the boards were again rinsed with tap-water at room temperature. After the rinsing, the printed circuit boards were immersed for 45 secs in a warm aqueous solution or dispersion at 40° C., which contained thiourea (30 g/l), sulphuric acid (20 g/l), 200 mg/l silver as silver sulphate and 1 g/l of a 4% aqueous dispersion of polyaniline. A uniformly silvery-translucent layer was deposited. Next the printed circuit boards were tinned in a conventional manner using a $Sn^{2+}$-containing bath.

The thickness of the silver layer measured by X-ray fluorescence spectroscopy before the tinning was 10 nm, while a layer thickness of 40 nm was found when electrochemical measurement methods were used (galvanocoulometry). The explanation for this divergence lies in the organic component of the layer.

The printed circuit boards were investigated by secondary ion mass spectrometry (SIMS). In this investigation method, the layer is removed and analysed layer by layer. Short sputter times correspond to the outer regions of the layer, while with longer sputter times deeper regions of the layer are displayed. A sputter time of 500 secs here corresponds roughly to a layer thickness of 800 nm, i.e. after 500 secs the upper 800 nm of the layer have been removed.

FIG. 1 shows the SIMS spectrum 10 of the layer (iii) after the tinning. It can clearly be seen that the silver is present distributed over the whole layer region investigated and surprisingly displays a concentration at the surface (sputter time 0 to 500 secs) one to two orders of magnitude higher than inside the layer, although the silver was applied before the tinning. Likewise, it can clearly be seen that the tin and copper concentrations decline uniformly over the layer thickness. The curve "CuzuSn" gives the ratio of copper to tin. After a sputter time of about 1900 secs (corresponding to about 3 μm), this reaches a value of $10^{-4}$. The spectrum confirms the formation of an alloy or a finely divided mixture of the metals. This may be compared to the SIMS spectrum 12 of FIG. 2 of a sample prepared by conventional processes.

Figure 3:
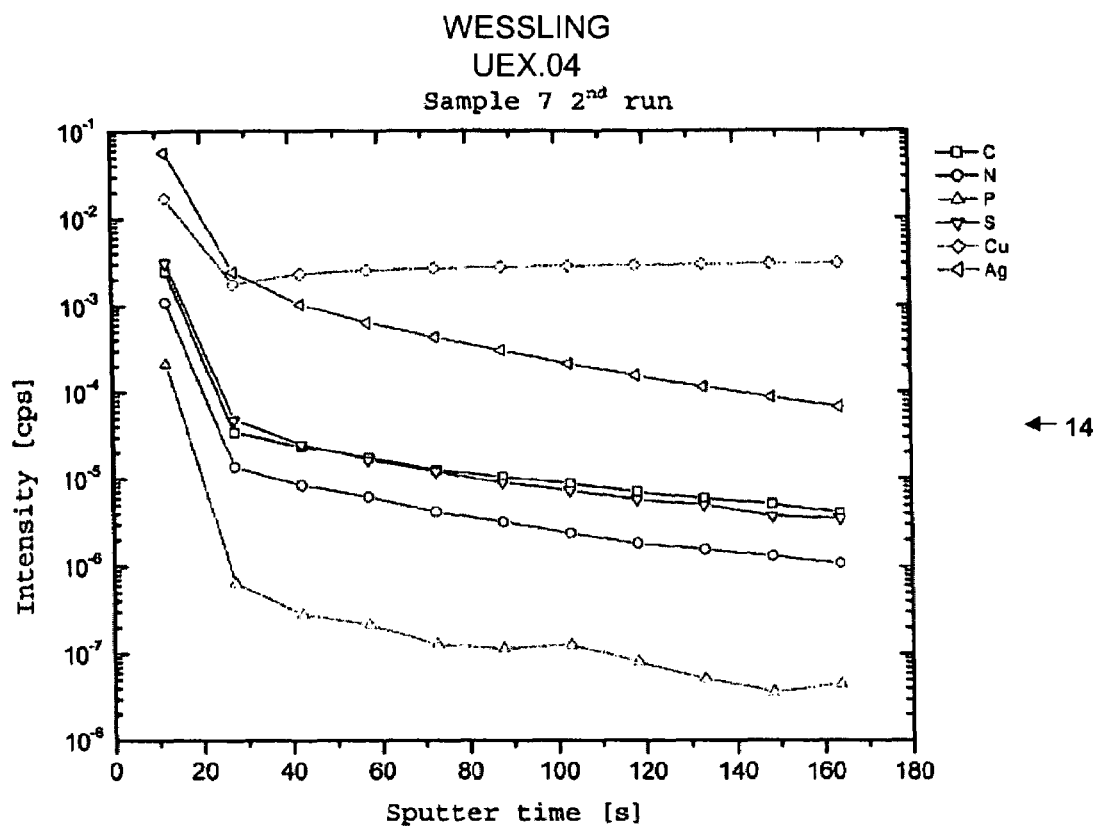
FIG. 3 shows a secondary ion mass spectrum of a silver layer suitable according to the invention on a printed circuit board.

FIG. 3 shows a spectrum of the silver layer recorded by secondary ion mass spectrometry before the tinning. The spectrum shows that in addition to silver and copper the layer contains not inconsiderable amounts of the elements C, N, P and S, which derive from the organic additives used.

Figure 4:
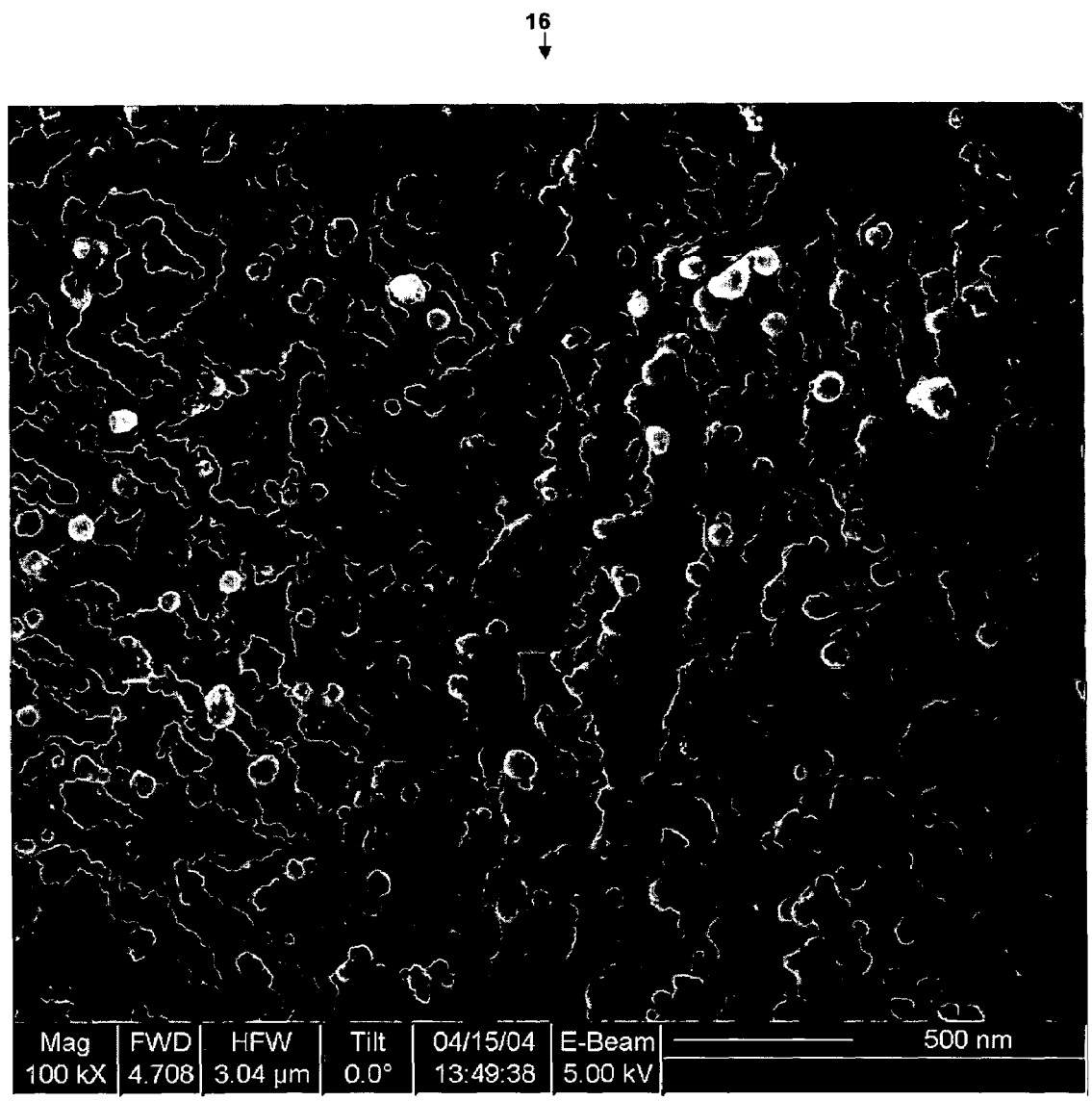
FIG. 4 shows an electron micrograph of a silver layer suitable according to the invention on a printed circuit board.

FIG. 4 shows an electron micrograph 16 of the silver layer. The open pore, porous structure of the layer can be clearly discerned.

Figure 5:
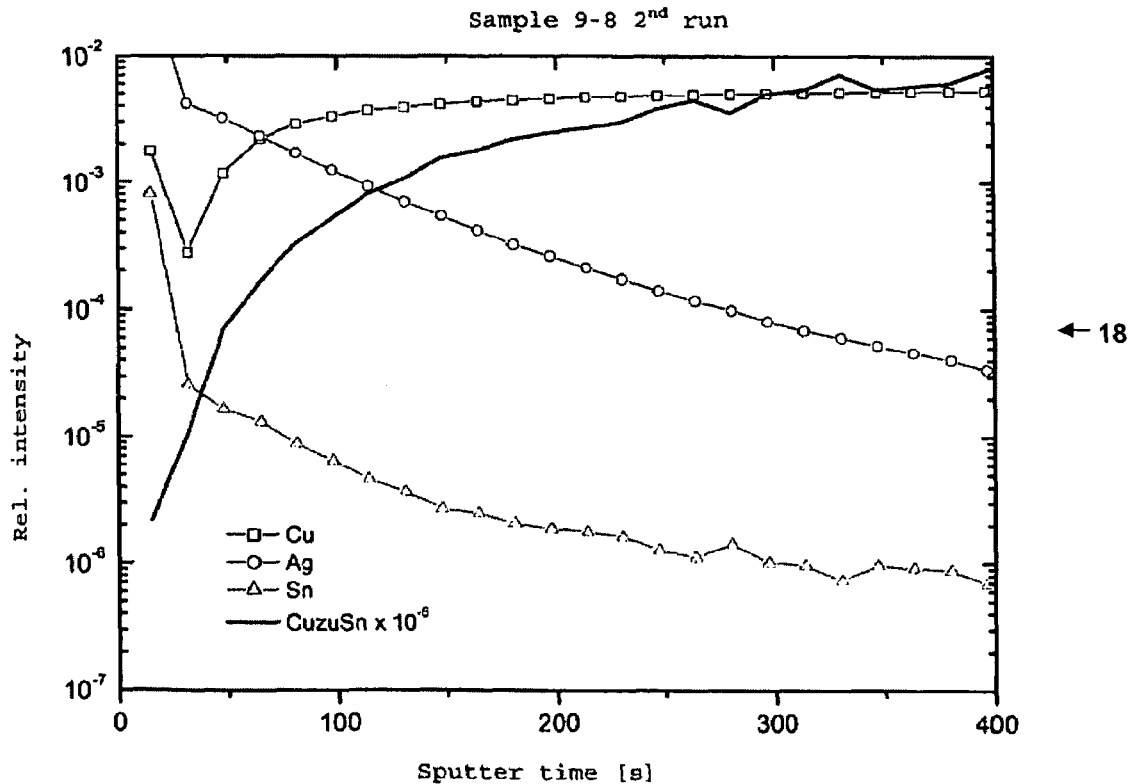
FIG. 5 shows a secondary ion mass spectrum of a silver layer not suitable according to the invention on a printed circuit board.

In comparison to this, FIG. 5 shows the SIMS spectrum 18 of a silver layer which was obtained with higher silver concentration, higher temperature and longer residence time of the printed circuit board in the silver bath. The silver layer is markedly thicker and more compact than the layer 14 shown in FIG. 3, so that hardly any tin can now be deposited on it.

Examples 2 to 7

Production of Coated Printed Circuit Boards
(Comparison)

Analogously to Example 1, printed circuit boards were tinned with normal commercial agents in accordance with the respective use instructions. The products ORMECON CSN (Ormecon GmbH, Ammersbek, Example 2), ORMECON CSN FF (Ormecon GmbH, Ammersbek, Example 3), Shipley Tinposit LT 34 (Example 4), Unicron G 2 (Unicron GmbH, Kirchheimbolanden; Example 5), OMIKRON (Cirtech Co., Florida, USA; Example 6) and Stannatech (Atotech Co., Berlin; Example 7) were used.

Figure 2:
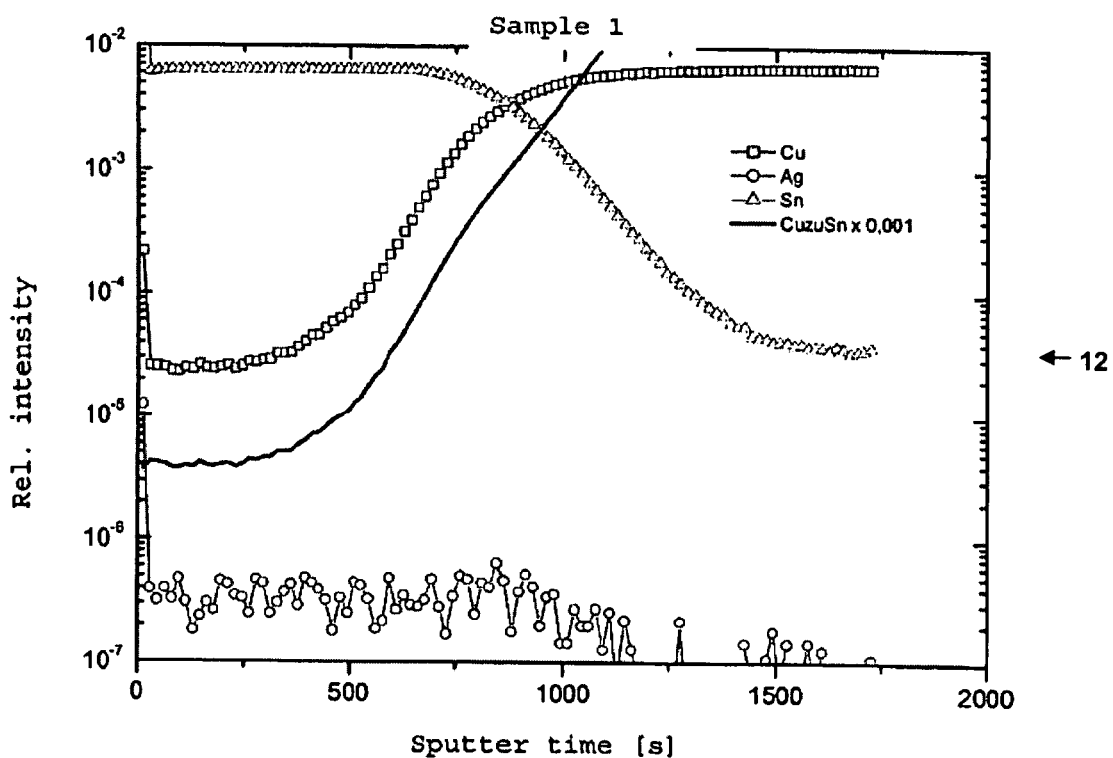
FIG. 2 shows a secondary ion mass spectrum of a layer (iii) of a printed circuit board created with conventional processes.

FIG. 2 shows the secondary ion mass spectrum 12 of the printed circuit board from Comparison Example 3. From a comparison with FIG. 1 it can clearly be seen that the tin and copper concentrations display discontinuous profiles, i.e. the tin layer abruptly decreases at a sputter time of about 900 secs, while the copper concentration abruptly rises at the same time. This indicates a substantial separation of the layers. The copper to tin ratio of $10^{-4}$ is already reached here after a much shorter sputter time.

Example 8

Determination of Whisker Size

The printed circuit boards produced in Examples 1 to 7 were stored for 7 and 14 weeks at room temperature. Next, the plates were examined for the formation of whiskers by optical microscopy and if relevant the size of the whiskers was determined. For this, drill holes of 1 mm diameter were viewed, since whiskers were easier to detect here on account of the dark background. The results are shown below in Table 1.

TABLE 1

Determination of Whisker Size

| Example | Storage Time 7 Wks Whisker Size | Storage Time 14 Wks Whisker Size |
|---|---|---|
| 1 | no whiskers | no whiskers |
| 2* | 10-20 μm | —1) |
| 3* | 20-30 μm | —1) |
| 4* | >100 μm | —1) |
| 5* | >100 μm | —1) |
| 6* | 20-30 μm | —1) |
| 7* | 20-30 μm | —1) |

*Comparison Example
1)Not Measured

Figure 6:
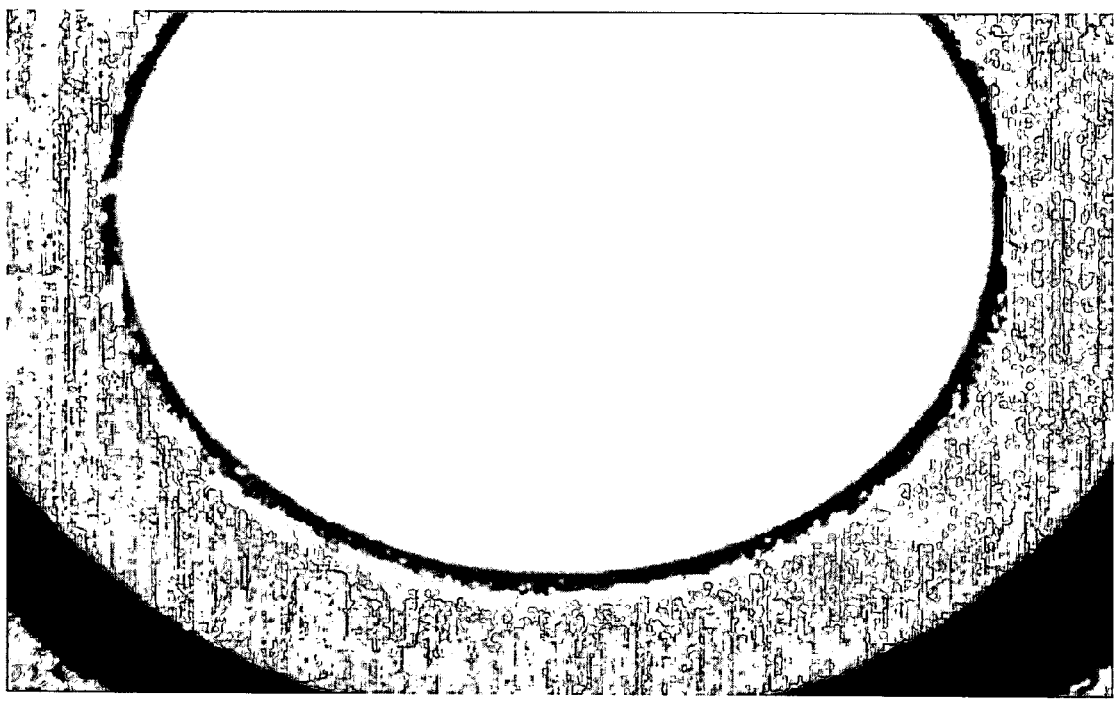
FIG. 6 shows an optical micrograph of a 1 mm drill hole in a printed circuit board coated according to the invention.

FIG. 6 shows an optical micrograph 20 of a printed circuit board from Example 1 after storage for 14 weeks. No whisker formation can be discerned.

Figure 7:
FIG. 7 shows an optical micrograph of a 1 mm drill hole in a printed circuit board coated not according to the invention.

FIG. 7 shows an optical micrograph 22 of the printed circuit board from Comparison Example 3 after storage for 7 weeks. The picture is focussed on a whisker fibre in the upper region of the drill hole (at 12 o'clock).

Figure 8:
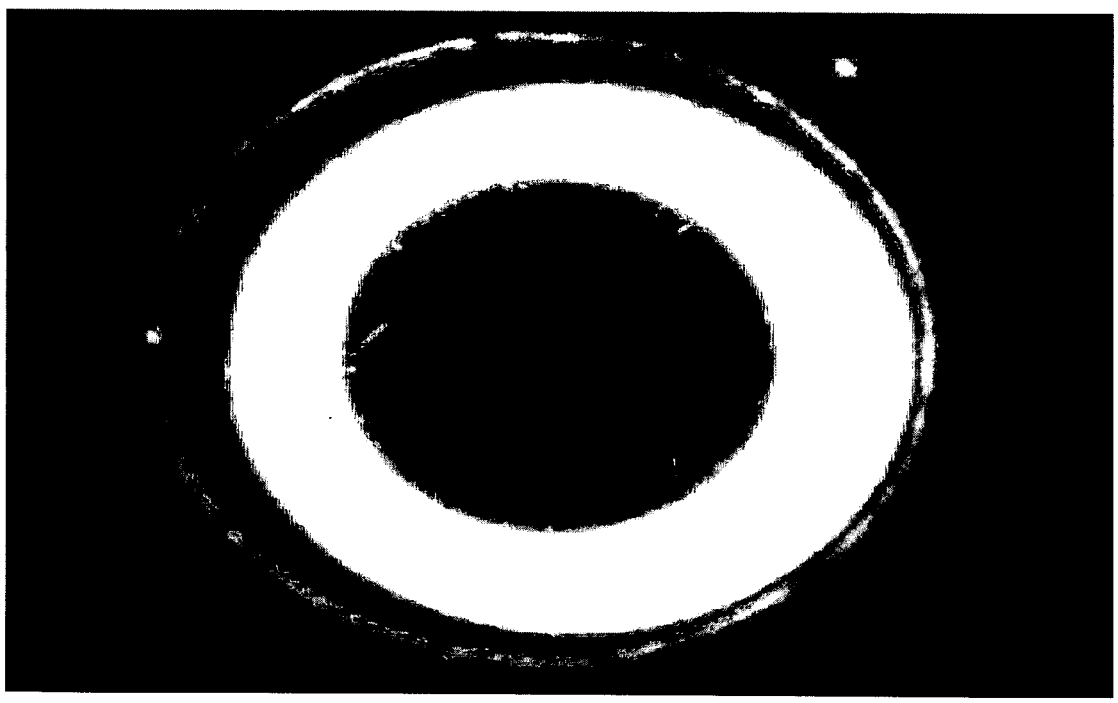
FIG. 8 shows an optical micrograph of a 1 mm drill hole in another printed circuit board coated not according to the invention.

FIG. 8 shows a picture 24 of a printed circuit board according to Comparison Example 4 after storage for 7 weeks. Here a large number of whiskers can be discerned in the focus plane.

While the invention has been particularly shown and described with reference to a number of embodiments, it would be understood by those skilled in the art that changes in the form and details may be made to the various embodiments disclosed herein without departing from the spirit and scope of the invention and that the various embodiments disclosed herein are not intended to act as limitations on the scope of the claims.

What is claimed is:

1. A coated article comprising:
    (i) at least one electrically non-conductive base layer,
    (ii) at least one layer of at least one of copper and a copper alloy, and
    (iii) a tin-containing layer, wherein the layer (ii) is positioned between the layer (i) and the layer (iii), characterized in that the tin-containing layer (iii) contains at least one other metal which is selected from the group consisting of Mg, Ca, Zr, Mn, Ni, Pd, Pt, Cu, Ag, Au, Zn, Ga, In, Ge, Sb, and Bi and at least one organic additive and wherein the concentration of the other metal varies over the thickness of the layer (iii) and wherein the concentration of the at least one other metal at the interface of layer (ii) and layer (iii) is lower than in a sublayer of the layer (iii) lying away from the interface of layer (ii) and layer (iii).

2. The coated article according to claim 1, wherein the at least one other metal is one of silver, platinum, gold, nickel, bismuth, copper and a combination of more than one of these metals.

3. The coated article according to claim 1, wherein the layer (iii) contains an alloy of tin and at least one other metal.

4. The coated article according to claim 1, wherein the layer (iii) contains one of a finely divided and multiphase mixture of tin and at least one other metal.

5. The coated article according to claim 4, wherein the finely divided or multiphase mixture of tin and at least one other metal comprises metal particles or metal phases having a size of 1 to 500 nm.

6. The coated article according to claim 1, wherein the organic additive contains at least one of the elements carbon, sulphur and nitrogen.

7. The coated article according to claim 1, wherein the layer (iii) additionally contains one of a complexing agent and an electrically conductive polymer.

8. The coated article according to claim 7, wherein the organic additive is capable of complex formation with copper.

9. The coated article according to claim 7, wherein the organic additive is selected from a group consisting of polyanilines, polythiophenes, polypyrroles, thiourea, imidazoles, benzimidazoles, benzotriazoles, urea, citric acid, imidazolethiones and mixtures thereof.

10. The coated article according to claim 1, wherein the layer (iii) contains

| | |
|---|---|
| 20 to 99.5 wt.% | tin, |
| 0.01 to 80 wt.% | other metal, |
| 0 to 80 wt.% | complexing agent and |
| 0 to 80 wt.% | electrically conductive polymer, | each based on the total mass of the layer (iii).

11. The coated article according to claim 1, wherein the layer (iii) contains 1 ppb to 5 wt. % organic additive.

12. The coated article according to claim 1, wherein the layer (i) has a layer thickness of 0.1 to 3 mm.

13. The coated article according to claim 1 wherein the layer (ii) has a layer thickness of 5 to 210 μm.

14. The coated article according to claim 1 wherein the layer (iii) has a layer thickness of 50 nm to 4 µm.

15. The coated article according to claim 1, wherein a tin concentration in a 300 nm to 3 µm thick sublayer of the layer (iii), away from the interface with layer (ii) is more than 50 mol. %.

16. The coated article according to claim 1 wherein the concentration of the other metal in the uppermost 0.5 to 5% thickness of the layer (iii) opposite the interface with layer (ii) is lower than the concentration of the other metal in the next 2 to 10% thickness of the layer (iii) toward the interface with layer (ii), and is higher than the concentration of the other metal in the 5 to 95% thickness of the layer (iii) lying thereunder.

17. The coated article according to claim 1 in the form of a printed circuit board.

18. The coated article according to claim 1 wherein the at least one other metal in layer (iii) is silver.

19. A coated article comprising:
(i) at least one electrically non-conductive base layer,
(ii) at least one layer of at least one of copper and a copper alloy, and
(iii) a tin-containing layer, wherein the layer (ii) is positioned between the layer (i) and the layer (iii), characterized in that the tin-containing layer (iii) contains at least one other metal which is selected from the group consisting of Mg, Ca, Zr, Mn, Ni, Pd, Pt, Cu, Ag, Au, Zn, Ga, In, Ge, Sb, and Bi and at least one organic additive, and wherein the concentration of the other metal varies over the thickness of the layer (iii) and wherein the concentration of the at least one other metal at the surface of layer (iii) is higher than the concentration of said at least one other metal in layer (iii) toward the interface with layer (ii).

* * * * *